SUBSTRATE CONFIGURATIONS FOR HALL ELEMENTS

Filed June 9, 1964 2 Sheets-Sheet 1

INVENTORS.
KERMIT K. W. HEID
LEON B. HORNBERGER
BY
FOWLER, KNOBBE
& GAMBRELL
ATTORNEYS.

SUBSTRATE CONFIGURATIONS FOR HALL ELEMENTS

Filed June 9, 1964 2 Sheets-Sheet 2

INVENTORS.
KERMIT K. W. HEID
LEON B. HORNBERGER
BY
FOWLER, KNOBBE & GAMBRELL
ATTORNEYS.

United States Patent Office 3,296,573

Patented Jan. 3, 1967

3,296,573

SUBSTRATE CONFIGURATIONS FOR HALL ELEMENTS

Kermit K. W. Heid, Anaheim, and Leon B. Hornberger, Huntington Beach, Calif., assignors to Beckman Instruments, Inc., a corporation of California Filed June 9, 1964, Ser. No. 373,617
5 Claims. (Cl. 338—32)

The present invention relates to electrically non-conductive substrates adapted for supporting deposited materials and, more particularly, to improvements in substrate configurations for Hall Effect elements.

The contemporary Hall element comprises a thin layer of semiconductor material exhibiting the Hall effect supported upon a dielectric substrate. When a mutually orthogonal magnetic field and control current are applied to the Hall element, a Hall voltage may be measured along an axis orthogonal to the control current and magnetic field axes, which voltage is proportional to the product of the current and magnetic field. An exemplary type of Hall element is constructed from the compounds indium antimonide or indium arsenide which are evaporated upon the substrate in accordance with the teachings of U.S. Patent No. 3,082,124 entitled "Method of Making Thin Layer Semiconductor Devices," assigned to Beckman Instruments, Inc., assignee of the present invention.

As a result of its inherent multiplication effect, the Hall element has many fields of application. Other advantages of the Hall element include a large dynamic range on both inputs, electrical isolation between the inputs and between one input and the output. No active circuits are ordinarily required, contributing to the simplicity of the overall circuitry. In addition, the Hall generator is an extremely broadband device, operating from D.C. into the megacycle region and theoretically capable of operation at gigacycle frequencies.

However, certain error voltages are generated along with the Hall voltage output in contemporary Hall devices. These error currents may be classified as "intrinsic" and "extrinsic," the former being those due to the Hall plate, associated leads and connections, and the immediate supporting and protective parts. The extrinsic errors are those due to the "outside world," including the associated magnetic circuit, earth's field, driving circuits, and mechanical supports.

It is the object of the present invention to provide improvements in substrate configurations for Hall elements which substantially reduce certain of the "intrinsic" error terms. In particular, Hall elements constructed in accordance with the present invention have substantially reduced inductive null voltages and self field voltages due respectively to the pick-up loops formed by the input and output leads and to the interaction of the control current and the magnetic field produced by this same control current.

It is a further object of the present invention to provide improvements in substrate configurations for Hall elements which substantially simplify the manufacture of Hall elements, thereby decreasing their unit cost.

It is a further feature of the present invention that Hall elements constructed in accordance with the teachings thereof are very closely identical to one another in their electrical characteristics.

Other and further objects, features, and advantages of the invention will become apparent as the description proceeds.

In brief, in accordance with a preferred embodiment of the present invention, there is provided a thin substrate for supporting a layer of semiconductor material exhibiting the Hall Effect on one side thereof and supporting and containing substantially between the opposite surfaces of the substrate, conductors which make electrical contact with the semiconductor element at points remote from the edges of the substrate. These conductors are provided by channels formed on the side of the substrate opposite the semiconductor material and extending from respective apertures in the substrate surface to a common edge of the substrate. The channels and substrate apertures are lined with conductor material prior to the application of the semiconductor material which, when applied to the substrate, makes direct electrical physical contact with the conductor material to thereby form excellent electrical input and output terminations for the Hall element.

Hall elements so constructed have been found to have highly consistent and predictable electrical characteristics. Moreover, as described hereinafter, the channels are advantageously formed in a predetermined configuration to minimize the inductive null voltage and the self-field voltage.

A more thorough understanding of the invention may be obtained by a study of the following detailed description taken in conjunction with the accompanying drawings in which.

Figure 1:
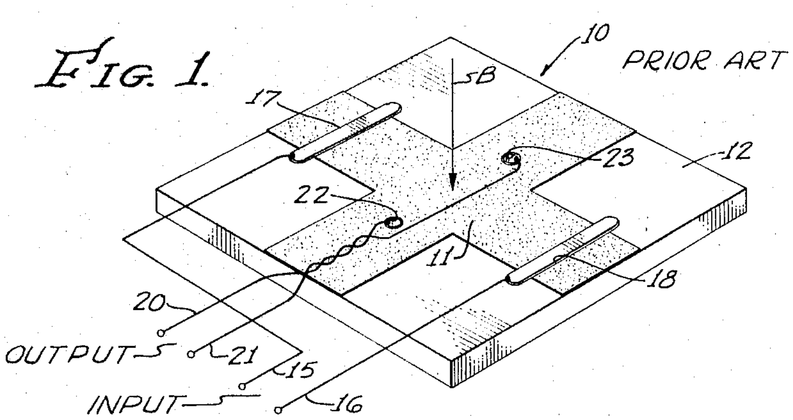
FIG. 1 is a perspective view of the representative prior art Hall element.

Referring now to FIG. 1, there is shown a representative prior art Hall element 10 comprising a thin layer 11 of semiconductor material exhibiting the Hall Effect phenomena deposited upon a substrate support 12. Input control current leads 15, 16 are attached to respective conductive terminations 17, 18 extending over the entire width of the Hall element. Output leads 20, 21 are attached to respective point terminations 22, 23 located on an axis orthogonal to the control current flow. In use, a magnetic field density vector B is applied along a third axis orthogonal to the control current and output axes.

The classic Hall voltage equation may be written as:

$$V_H = R_H/tI_cB \sin \theta \qquad (1)$$

where $V_H$=Hall voltage (2)

$R_H$=Hall coefficient (3)

$t$=Thickness of the Hall plate (4)

$I_c$=Control current through Hall plate (5)

$B$=Magnetic field density (6)

$\theta$=Angle between the current and magnetic field (7)

This expression is derived assuming a Hall plate of infinite length and holds true for a length to width ratio of 2.5 or greater.

However, in order to create the necessary conditions for a Hall voltage output, certain error voltages are generally produced. Considering certain of these error terms, the output voltage of the Hall element is more accurately written:

$$V_H = KI_cB \sin \theta + f(A_1, A_2)dB/dt + DI_c^2 \ldots \quad (8)$$

Obviously, only the first term on the right-hand side of the equation is desired. The other terms are error terms respectively due to the inductive null voltage and the self-field voltage.

Figure 2:
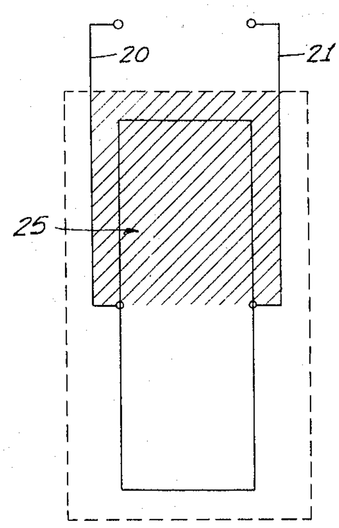
FIG. 2 is a schematic representation of an inductive coupling loop.

Considering first the error term $f(A_1, A_2)dB/dt$, this error voltage is due to the pick-up loops formed by the input and output leads where $A_1$ is the area of the input loop and $A_2$ is the area of the output loop. The e.m.f. induced in the electrical lead pick up loops is given by the equation:

$$e = d\lambda/dt \quad (9)$$

where $e$ is the induced e.m.f., $\lambda$ is the flux linkage in Weber-turns and $t$ is time measured in seconds. In general, the flux linkage $\lambda$ may be stated as an integrated effect over the area S as $$\lambda = \int_S B ds \quad (10)$$

where the area S is perpendicular to the flux density at all points. An illustration of the generation of these induced voltages is provided in FIG. 2 where it will be seen that the area 25 designated by the hatching is enclosed by the respective output leads 20, 21.

Figure 3:
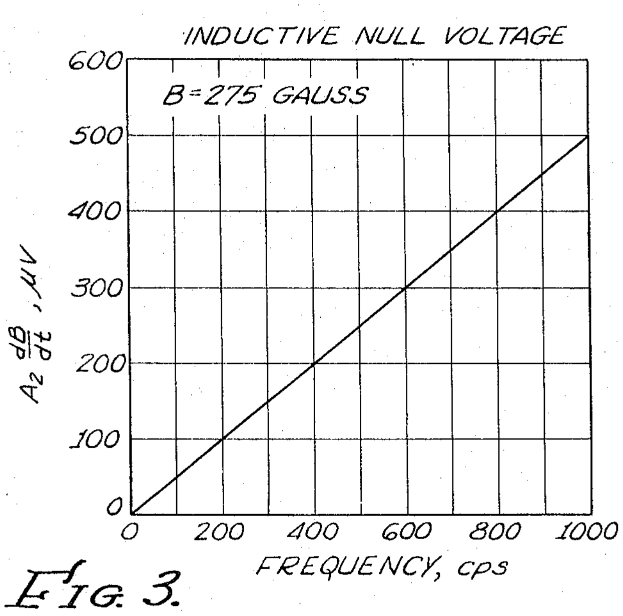
FIG. 3 is a graph showing the relationship of the induced voltage in the output circuit for a constant m.m.f. applied to the magnetic circuit.

For a given amplitude of flux density, the inductive null error voltages vary directly with frequency. By way of specific example, the relationship of the induced voltage in the output circuit for a constant m.m.f. applied to the magnetic circuit for a representative Hall element is tabulated in the graph of FIG. 3. An illustration of the generation of these induced voltages is provided in FIG. 2 where it will be seen that the area 25 designated by the hatching is enclosed by the respective output leads 20, 21.

A reduction in the inductive null voltage can be achieved by twisting the leads as shown in the embodiment of FIG. 1; however, there still remains an area, although smaller, which is enclosed by the leads. Moreover, this area will be different from element to element according to the dexterity of the person assembling the Hall element and thus this error term will not be consistently predictable from unit to unit.

Figure 4:
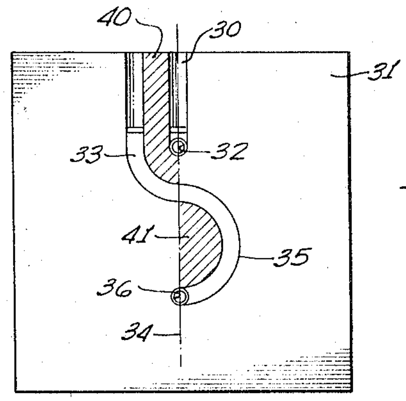
FIG. 4 is a bottom view of a substrate including output conductors formed in accordance with the present invention.

A particular advantage of the substrate configurations constructed according to the present invention is that the conductor structure is physically defined during the manufacture of the substrate and remains constant from one Hall element to another. Referring now to FIG. 4, there is shown a preferred configuration for the output conductors comprising a first channel 30 formed in the side of the substrate opposite that one which the semiconductor material is deposited, this channel extending linearly from an edge of the substrate 31 to an aperture 32 which extends through to the other side of the substrate. The other output conductor is also formed by a channel 33 in the surface of the substrate 31, this channel extending from the same edge as conductor 30 and extending linearly parallel therewith to approximately the distance of aperture 32 after which the channel 33 begins to curve toward the longitudinal axis 34 of channel 30 to a point therebeyond 35 and then returns to said axis, terminating at a second aperture 36 which also extends through to the other side of the Hall element. As described in more detail hereinafter, electrically conductive material is disposed in the respective channels 30, 33 and apertures 32, 36 so that suitable electrical contact is made with the Hall film disposed on the opposite side of substrate 31. The conductor structure of FIG. 4 is such that a first enclosed area 40 is defined by the respective linear portions of conductors 30, 33 and a second area 41 defined by the arcuate portion of the channel 33. By extending channel 33 beyond the other side of axis 34, the respective areas will be seen to lie on opposite sides of conductor 33. Therefore, when this substrate structure is disposed in a magnetic field, the inductive null voltage associated with area 40 will be opposite in polarity to the inductive null voltage associated with area 41; and by making the areas 40 and 41 substantially equal, the error voltages caused by the output conductors are effectively cancelled. Further, any residual inductive null voltage produced by the output conductors will not only be a very small value but will also remain a predictably constant value from one element to another because of the fixed conductor structure formed by the substrate.

Figures 5, 6, 7, 8, 9:
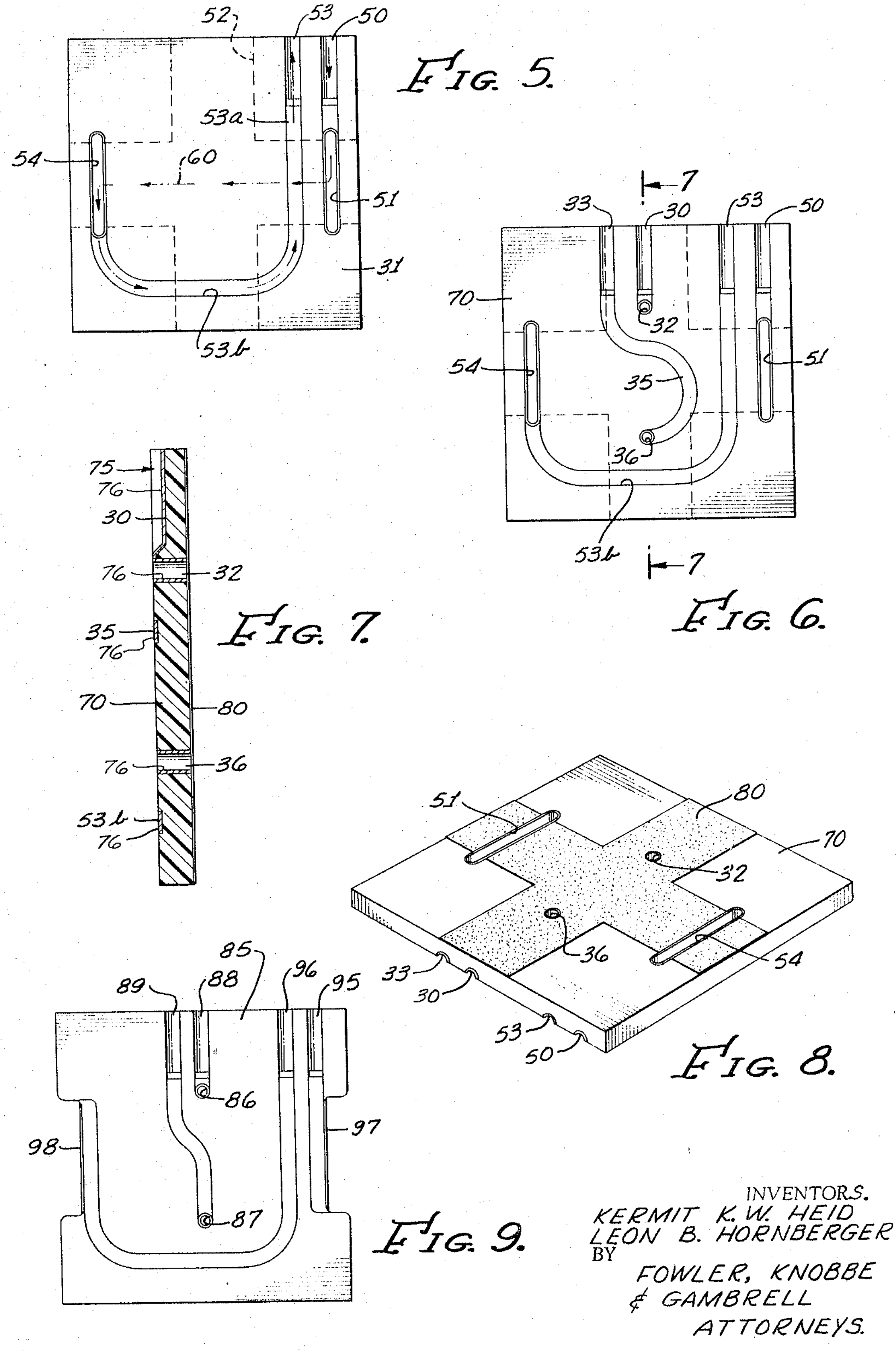
FIG. 5 is the bottom view of a substrate including input conductors constructed in accordance with the present invention.
FIG. 6 is a bottom view of a completed substrate constructed in accordance with the present invention.
FIG. 7 is an enlarged sectional view taken along line 7—7 of FIG. 6.
FIG. 8 is an isometric view of a completed Hall element device constructed in accordance with the present invention.
FIG. 9 is a bottom view of a modified substrate configuration constructed in accordance with the present invention.

An advantageous configuration for the control current input conductors is shown in FIG. 5 wherein a first channel 50 is formed in the surface of the substrate opposite that which supports the Hall material 52, this channel extending linearly from one edge of the substrate to an elongated slot 51 which extends through to the other side of the substrate 31. The other control current conductor 53 extends from the same side of the substrate 31 as conductor 50, this conductor having a first portion 53*a* extending parallel with channel 50 and slot 51 and a second portion, 53*b*, extending perpendicular thereto to a second elongated slot 54 which extends through to the other side of the substrate 31.

Electrically conductive material is disposed in both the channels 50, 53 and the elongated slots, the latter providing a termination extending across the entire width of the Hall element 52.

The current flow through the respective conductors 50, 53 and Hall element 52 is shown by the plural arrows of FIG. 5. It will be noted that the current flow 60 through the Hall element itself is opposite the current flow to the adjacent and parallel portion 53*b* of conductor 53. These currents flowing in opposite directions to one another and approximately adjacent one another substantially reduce the self-field voltages generated by the control current interacting with its magnetic field. Furthermore, the fixed conductor structure shown in FIG. 5 insures that any error voltage due to this effect will be not only a very small value but also a predictably constant value from one element to another.

FIGS. 6, 7 and 8 illustrate a preferred embodiment of the invention combining the concepts described hereinabove and illustrated in FIGS. 4 and 5. As shown, substate 70 is advantageously molded or otherwise formed of a dielectric material which is typically a refractory compound such as alumina, steatite or beryllium oxide. These ceramic materials allow the substrate to be made quite thin and yet provide ample strength. Ceramic materials have the further advantages of temperature stability and good thermal conductivity which substantially aid in the stabilization of the temperature sensitive Hall element. Of the group of materials noted, beryllium oxide has a particularly excellent thermal conductivity.

The mold cavity in which the substrate 70 is formed is so shaped that the grooves for the respective conductive channels 30, 33, 50, 53, the aperture holes 32, 36 and slots 51, 54 (employing the numerals used in conjunction with FIGS. 4 and 5) are simultaneously formed. As shown in FIG. 6, the conductor configurations described hereinabove define distinct and non-overlapping paths on one face of the substrate and advantageously permit all of the conductors to terminate along a common edge of the substrate 70, thereby materially simplifying the connection of the completed Hall element into other electrical circuitry. This also produces a more rugged Hall generator in that the external leads are not as vulnerable to damage as when they project from more than one edge of the substrate.

Also, referring to FIG. 7, it will be seen that the channels are formed with a deeper groove depth 75 near the edge of the substrate so that an external conductive lead can be affixed within the portion of the channel abutting the external edge of the substrate 70. The substrate structure of this invention is such that the external leads may be very quickly and securely fastened to the substrate conductors by a welding operation. This greatly facilitates the attachment of external leads over the prior art configurations by eliminating many tedious and costly manufacturing steps.

After the substrate is molded to the desired configuration, the channels, holes and slots are lined with a conductive material. An exemplary procedure for fabricating these metalized conductors comprises the following steps. First a metalizing material, such as molybdenum manganese or platinum-gold is applied to the formed substrate 70 so that the channels, holes, and slots are adequately lined with the material. The substrate is then fired and the molybdenum manganese firmly bonded to the substrate. These materials adhere well to the substrate and provide a base for a further layer or layers of metal to provide a conductor of high electrical conductivity. The final step comprises selecting a metal compatible with the semiconductor material 10 and plating this material onto the molybdenum manganese. Preferred metals for this final conductive plating are silver and gold. A conductive lining 76 is thus formed on each of channels, apertures, and elongated slots.

After the substrate is formed and the channels, apertures and slots are metalized, the semiconductive material exhibiting the Hall phenomena is deposited in a thin layer 80 on the opposite surface of the substrate as shown in FIG. 8. By utilizing a vacuum deposition method, such as described in U.S. Patent 3,082,124, supra, a Hall film that is only microns thick can be produced. This film extends to the insides of the apertures 32, 36 and slots 51, 54, thereby making excellent electrical connections with electrical conductors formed by the substrate.

In addition to the improved electrical characteristics described about, the substrate configurations of this invention provide both a unitary support and electrical terminations for the Hall element, with the electrical conductors being supported and contained substantially between the opposite surfaces of the substrate.

An underside view of a modified substrate configuration is shown in FIG. 9. The substrate 85 includes a pair of through apertures 86, 87 for providing the output terminations of the Hall element deposited on the other side of the substrate. These apertures are located at the ends of respective channels 88, 89 each extending from a common side of the substrate 85. As shown, channel 89 does not extend beyond the longitudinal axis of the parallel channel 88; accordingly, the maximum compensation for inductive null voltage is not obtained by this configuration. However, the advantages of a uniform and predictably constant error voltage are retained as attributes of this embodiment.

Substrate 85 further includes channels 95, 96 also extending from the same side of the substrate as channels 88, 89 and terminating along respective recesses, 97, 98 formed in oppositely disposed sides of the substrate 85.

As in the foregoing described embodiment, the surfaces of the channels 88, 89, 95, 96, apertures 86, 87 and edge surfaces of the recesses 97, 98 are lined with a conductive material. The elongated surfaces of the recesses 97, 98 make electrical contact across substantially the entire width of the Hall element so as to respectively provide the input terminations.

Although exemplary embodiments of the invention have been disclosed and discussed, it will be understood that other applications of the invention are possible and that the embodiments disclosed may be subjected to various changes, modifications and substitutions without necessarily departing from the spirit of the invention.

We claim:

1. In a substrate providing a unitary support and electrical terminations for a Hall element mounted on one surface thereof, the improvement comprising:

a dielectric substrate having a pair of oppositely disposed substantially flat surfaces, one of said surfaces adapted to receive a Hall element in the form of a thin layer of Hall Effect material attached thereto, said substrate having a pair of apertures therethrough extending between said surfaces adjacent an output axis of said Hall element and a pair of elongated slots therethrough extending between said surfaces adjacent the control current input and output ends of said Hall element;

plural channels formed in said opposite surface of said substrate from said surface adapted to receive said Hall element, said channels each extending from a common edge of said substrate to intersect with and terminate in one of said apertures and slots formed through said substrate, each channel defining a district and non-overlapping path on said opposite surface of said substrate;

electrically conductive material lining said apertures, elongated slots and channels and cooperating with said apertures to define output terminations for said Hall element and cooperating with said elongated slots to define control current input and output terminations for said Hall element;

said electrically conductive channels terminating in said apertures being so arranged on said opposite surface of said substrate as to encompass first and second areas so disposed to one another that a given changing magnetic flux field enclosed thereby induces substantially equal magnitude and opposite polarity voltages in said conductors thereby producing a net cancellation of the inductive null voltages.

2. In a substrate providing both a unitary support and electrical terminations for a Hall element mounted on one surface thereof, the improvement comprising:

a dielectric substrate having a pair of oppositely disposed substantially flat surfaces, one of said surfaces adapted to receive a Hall element in the form of a thin layer of Hall Effect material attached thereto, said substrate having a pair of apertures extending therethrough between said surfaces adjacent an output axis of said Hall element and a pair of elongated slots therethrough extending between said surfaces adjacent the control current input and output ends of said Hall element;

plural channels formed in said opposite surface of said substrate from said surface adapted to receive said Hall element, said channels each extending from a common edge of said substrate to intersect with and terminate in one of said apertures and slots formed through said substrate, each channel defining a distinct and non-overlapping path on said opposite surface of said substrate;

electrically conductive material lining said apertures, elongated slots and channels and cooperating with said apertures to define output terminations for said Hall element and cooperating with said elongated slots to define control current input and output terminations for said Hall element;

one of said channels intersecting with an elongated slot having an elongated portion which extends adjacent to and parallel to the direction of flow of control current through said Hall element so that the control current through said Hall element and the control current through said elongated portion of said one channel flow in respectively opposite directions to thereby substantially cancel the self-field voltage generated by the control current interacting with its magnetic field.

3. In a substrate providing both a unitary support and electrical terminations for a Hall element mounted on one surface thereof, the improvement comprising:

a dielectric substrate having a pair of oppositely disposed substantially flat surfaces, one of said surfaces adapted to receive a Hall element in the form of a thin layer of Hall Effect material attached thereto, said substrate having a pair of apertures therethrough extending between said surfaces adjacent an output axis of said Hall element and a pair of elongated slots therethrough extending between said surfaces adjacent the control current input and output ends of said Hall element;

plural channels formed in said opposite surface of said substrate from said surface adapted to receive said Hall element, said channels each extending from a common edge of said substrate to intersect with and terminate in one of said apertures and slots, each channel defining a distinct and non-overlapping path on said opposite surface of said substrate;

electrically conductive material lining said apertures, elongated slots and channels, said electrically conductive material cooperating with said apertures to define the output terminations for said Hall element and cooperating with said elongated slots to define control current input and output terminations for said Hall element;

said electrically conductive channels terminating in said apertures encompassing first and second areas so disposed with respect to one another that a given changing magnetic flux field enclosed thereby induces substantially equal magnitude and opposite polarity voltages in said conductors thereby producing a net cancellation of the inductive null voltages; and one of said channels terminating in an elongated slot having an elongated portion which extends substantially adjacent to and parallel to the direction of flow of control current through said Hall element so that the control current through said Hall element and the control current through said elongated portion of said one channel flow in respectively opposite directions to thereby substantially cancel the self-field voltage generated by the control current interacting with its magnetic field.

4. A Hall Effect device comprising:

a thin flat substrate formed of a dielectric material having a pair of oppositely disposed substantially flat surfaces thereon;

a Hall Effect element in the form of a semiconductor material exhibiting the Hall Effect phenomena vacuum deposited upon one of said surfaces of said substrate;

said dielectric substrate having a pair of apertures therethrough communicating with said Hall element on said one surface of said substrate;

a pair of channels formed in the opposite surface of said substrate, each of said channels extending from a common edge of said substrate and intersecting with one of said apertures formed through said substrate;

electrically conductive material lining said apertures and said channels, said electrically conductive material thereby forming output terminations for said Hall element;

said channels being so constructed and arranged on said opposite surface as to define a pair of pick-up loops, one of said loops encompassing a first area bounded substantially by said channels and the other loop encompassing a second area bounded by one of said channels and an axis passing through said apertures, said areas being disposed on respectively opposite sides of one of said channels so that a given changing magnetic flux field enclosed by said pick-up loops formed by said channels induces substantially equal magnitude and opposite polarity voltages in said conductors thereby producing a net cancellation of the inductive null voltages when a current flows through said electrically conductive material lining said channels.

5. A Hall Effect device comprising:

a thin flat substrate formed of a dielectric material having a pair of oppositely disposed substantially flat surfaces thereon;

a Hall Effect element in the form of a semiconductor material exhibiting the Hall Effect phenomena vacuum deposited upon one of said surfaces of said substrate;

a first aperture through said dielectric substrate, a first channel on the opposite surface of said substrate from said Hall element extending linearly from one edge of said substrate and intersecting with said first aperture, a second aperture through said substrate disposed on the extended longitudinal axis of said first channel, and a second channel formed in said opposite surface extending from said one edge of said substrate to said second aperture;

said second channel defining a first loop extending on one side of the extended longitudinal axis of said first channel and a second loop extending on the opposite side of said longitudinal axis of said first channel so that said first channel, said second channel and said longitudinal axis of said first channel encompass first and second loops on opposite sides of said second channel.

References Cited by the Examiner

UNITED STATES PATENTS

| | | | |
|---|---|---|---|
| 2,804,581 | 8/1957 | Lichtgarn | 317—234 |
| 2,914,728 | 11/1959 | Brophy et al. | 324—45 |
| 3,030,559 | 4/1962 | Borneman et al. | 324—45 X |
| 3,042,887 | 7/1962 | Kuhrt et al. | |
| 3,082,124 | 3/1963 | French et al. | 117—211 |
| 3,143,714 | 8/1964 | Evans et al. | 307—88.5 |
| 3,163,588 | 12/1964 | Shortt et al. | 174—68.5 X |
| 3,200,298 | 8/1965 | Garibotti | 317—101 |
| 3,202,913 | 8/1965 | Marinace | 307—88.5 X |
| 3,239,786 | 3/1966 | Shang. | |

FOREIGN PATENTS

| | | |
|---|---|---|
| 983,769 | 2/1965 | Great Britain. |

RICHARD M. WOOD, *Primary Examiner.*

ANTHONY BARTIS, *Examiner.*

W. D. BROOKS, *Assistant Examiner.*